(12) United States Patent
McDaniel et al.

(10) Patent No.: US 6,844,255 B2
(45) Date of Patent: *Jan. 18, 2005

(54) METHODS OF PROVIDING AN INTERLEVEL DIELECTRIC LAYER INTERMEDIATE DIFFERENT ELEVATION CONDUCTIVE METAL LAYERS IN THE FABRICATION OF INTEGRATED CIRCUITRY

(75) Inventors: Terrence McDaniel, Boise, ID (US); Max F. Hineman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1 day.

This patent is subject to a terminal disclaimer.

(21) Appl. No.: 10/011,212

(22) Filed: Oct. 9, 2001

(65) Prior Publication Data

US 2003/0068879 A1 Apr. 10, 2003

Related U.S. Application Data

(63) Continuation of application No. 09/366,508, filed on Aug. 3, 1999, now Pat. No. 6,350,679.

(51) Int. Cl.[7] ........................................... H01L 21/4763
(52) U.S. Cl. ...................... 438/618; 438/622; 438/623; 438/631; 438/634; 438/645; 438/647; 438/648
(58) Field of Search .................................. 438/634, 618, 438/622, 623, 631, 645, 647, 648

(56) References Cited

U.S. PATENT DOCUMENTS

| | | |
|---|---|---|
| 3,919,060 A | 11/1975 | Pogge et al. |
| 3,954,523 A | 5/1976 | Magdo et al. ............... 148/175 |
| 3,979,230 A | 9/1976 | Anthony et al. |
| 3,998,662 A | 12/1976 | Anthony et al. |

(List continued on next page.)

FOREIGN PATENT DOCUMENTS

| | | |
|---|---|---|
| EP | 0 542 262 A | 5/1993 |
| EP | 0 923 125 A | 6/1999 |

OTHER PUBLICATIONS

Yoon et al, *Monolithic Integration of 3–D Electropated Microstructures with Unlimited Number of Levels* . . . IEEE International Micro–Electro Mechanical Systems Conference (1999) pp. 624–629.

Wolf et al., "*Silicon Processing for the VLSI Era*"; 1 Process Technology 429–437 (1986).

Watanabe et al., *A Novel Stacked Capacitor With Porous–Si Electrodes for High Density DRAMs*, Microelectronics Research Laboratories, NEC Corporation, Japan, #3A–1, pp. 17–18 (pre–1998).

Stanley Wolf, Ph.D., "Silicon Processing for the VLSI Era", vol. 1, Process Technology, Copyright 1986, Lattice Press.

Singer, Peter, "The New Low–k Candidate: It's a Gas", (Technology News/Wafer Processing) *Semiconductor International*, 1 Page, (Mar. 1989.

(List continued on next page.)

*Primary Examiner*—John F. Niebling
*Assistant Examiner*—Lynne A. Gurley
(74) *Attorney, Agent, or Firm*—Wells St. John P.S.

(57) ABSTRACT

The invention comprises methods of providing an interlevel dielectric layer intermediate different elevation conductive metal layers in the fabrication of integrated circuitry. In one implementation, a method of providing an interlevel dielectric layer intermediate different elevation conductive metal layers in the fabrication of integrated circuitry includes forming a conductive metal interconnect layer over a substrate. An insulating dielectric mass is provided about the conductive metal interconnect layer. The insulating dielectric mass has a first dielectric constant. At least a majority of the insulating dielectric mass is etched away from the substrate. After the etching, an interlevel dielectric layer is deposited to replace at least some of the etched insulating dielectric material. The interlevel dielectric layer has a second dielectric constant which is less than the first dielectric constant.

32 Claims, 5 Drawing Sheets

U.S. PATENT DOCUMENTS

| | | | |
|---|---|---|---|
| 4,063,901 A | 12/1977 | Shiba | 29/578 |
| 4,180,416 A | 12/1979 | Brock | 148/1.5 |
| 4,561,173 A | 12/1985 | Te Velde | 29/577 C |
| 5,023,200 A | 6/1991 | Blewer et al. | 437/187 |
| 5,103,288 A | 4/1992 | Sakamoto et al. | 357/71 |
| 5,141,896 A | 8/1992 | Katoh | 437/195 |
| 5,149,615 A | 9/1992 | Chakravorty et al. | 430/313 |
| 5,171,713 A | 12/1992 | Matthews | 437/189 |
| 5,192,834 A | 3/1993 | Yamanishi et al. | |
| 5,266,519 A | 11/1993 | Iwamoto | 438/193 |
| 5,286,668 A | 2/1994 | Chou | 437/52 |
| 5,298,311 A | 3/1994 | Bentson et al. | 428/216 |
| 5,380,679 A * | 1/1995 | Kano | 437/192 |
| 5,461,003 A | 10/1995 | Havemann et al. | 437/187 |
| 5,464,786 A | 11/1995 | Figura et al. | 438/52 |
| 5,470,801 A | 11/1995 | Kapoor et al. | 437/238 |
| 5,488,015 A | 1/1996 | Havermann et al. | 437/195 |
| 5,494,858 A | 2/1996 | Gnade et al. | 437/231 |
| 5,496,773 A | 3/1996 | Rhodes et al. | 437/189 |
| 5,525,857 A | 6/1996 | Gnade et al. | 313/309 |
| 5,527,737 A | 6/1996 | Jeng | 437/195 |
| 5,554,567 A | 9/1996 | Wang | 437/195 |
| 5,555,966 A | 9/1996 | Figura et al. | 361/321.4 |
| 5,583,078 A | 12/1996 | Osenbach | 437/240 |
| 5,599,745 A | 2/1997 | Reinberg | 437/195 |
| 5,629,238 A | 5/1997 | Choi et al. | 438/645 |
| 5,654,224 A | 8/1997 | Figura et al. | 439/306 |
| 5,670,828 A | 9/1997 | Cheung et al. | 257/773 |
| 5,691,565 A | 11/1997 | Manning | 257/632 |
| 5,691,573 A | 11/1997 | Avanzino et al. | 257/758 |
| 5,723,368 A | 3/1998 | Cho et al. | 437/763 |
| 5,736,425 A | 4/1998 | Smith et al. | 438/778 |
| 5,744,399 A | 4/1998 | Rostoker et al. | 438/622 |
| 5,773,363 A | 6/1998 | Derderian et al. | 438/672 |
| 5,804,508 A | 9/1998 | Gnade et al. | 438/778 |
| 5,807,607 A | 9/1998 | Smith et al. | 427/96 |
| 5,808,854 A | 9/1998 | Figura et al. | 361/321.4 |
| 5,861,345 A | 1/1999 | Chou et al. | 438/763 |
| 5,882,978 A | 3/1999 | Srinivasan et al. | 438/396 |
| 5,883,014 A | 3/1999 | Chen et al. | 438/782 |
| 5,950,102 A | 9/1999 | Lee | 438/619 |
| 5,967,804 A | 10/1999 | Yoshizawa et al. | 439/91 |
| 5,970,360 A | 10/1999 | Cheng et al. | 438/398 |
| 5,981,085 A | 11/1999 | Ninomiya et al. | 428/614 |
| 6,001,747 A | 12/1999 | Annapragada | 438/790 |
| 6,028,015 A | 2/2000 | Wang et al. | 438/789 |
| 6,156,374 A | 12/2000 | Forbes et al. | 428/97 |
| 6,245,439 B1 | 6/2001 | Yamada et al. | 428/546 |
| 6,251,470 B1 | 6/2001 | Forbes et al. | 427/97 |
| 6,313,046 B1 | 11/2001 | Juengling et al. | 438/781 |
| 6,333,556 B1 | 12/2001 | Juengling | 357/632 |
| 6,347,446 B1 | 2/2002 | Luthra et al. | 29/889.1 |
| 6,350,679 B1 * | 2/2002 | McDaniel et al. | 438/634 |

OTHER PUBLICATIONS

Product Brochure and Material Safety Data Sheet, "Interlayer Dielectric", *JSR Microelectronics*, 12 Pages (1997).

Togo, M., Et Al., "A Gate–Side Air–Gap Structure (GAS) To Reduce the Parasitic Capacitance in MOSFETs", *I.E.E.E.*, pp. 38–39 (1996).

Anand, M.B., Et Al., "Nura: A Feasible, Gas–Dielectric Interconnect Process", *I.E.E. E.*, pp. 82–83 (1996).

Abstract: Anderson, R.C., et al., "Porous Polycrystalline Silicon: A New Material For MEMS", *Journal of Microelectromechanical Systems*, vol. 3, No. 1, pp. 10–18 (Mar. 1994).

Homma, Tetsuya, "Low Dielectric Constant Materials And Methods For Interlayer Dieletric Films In Ultralarge–Scale Integrated Circuit Multilevel Interconnections", *Material Science & Engr.*, R23, pp. 243–285 (1998).

Abstract: Townsend, P.H., et al., "SiLK Polymer Coating With Low Dieletric Constant and High Thermal Stability for ULSI Interlayer Dielectric", *The Dow Chemical Company*, Midland, MI, 9 Pages, (Undated).

* cited by examiner

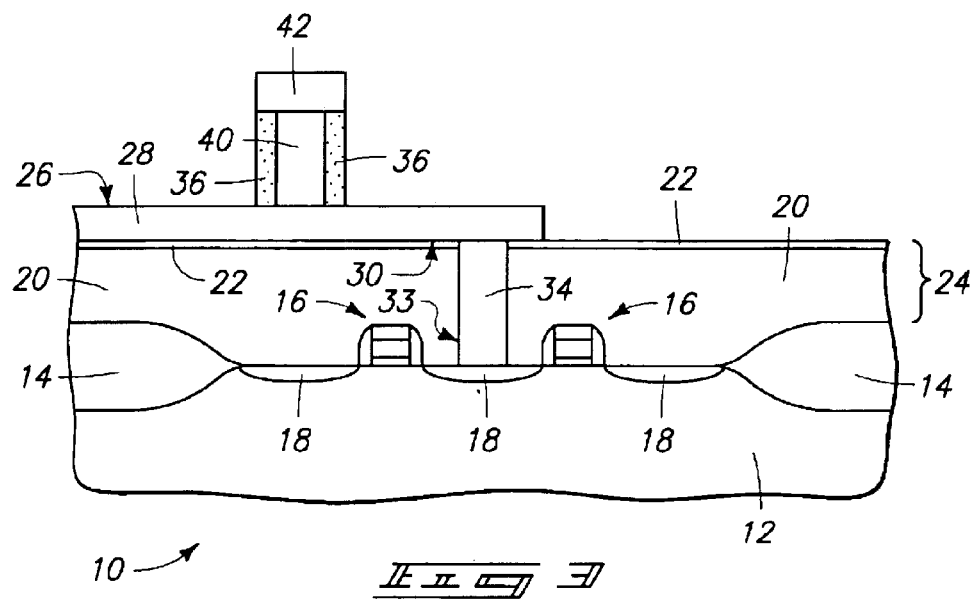
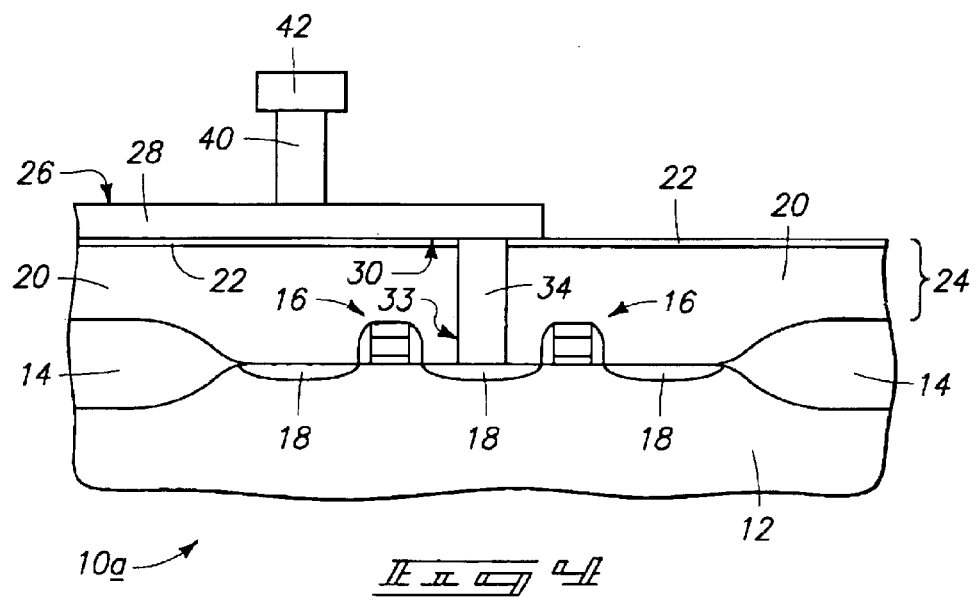

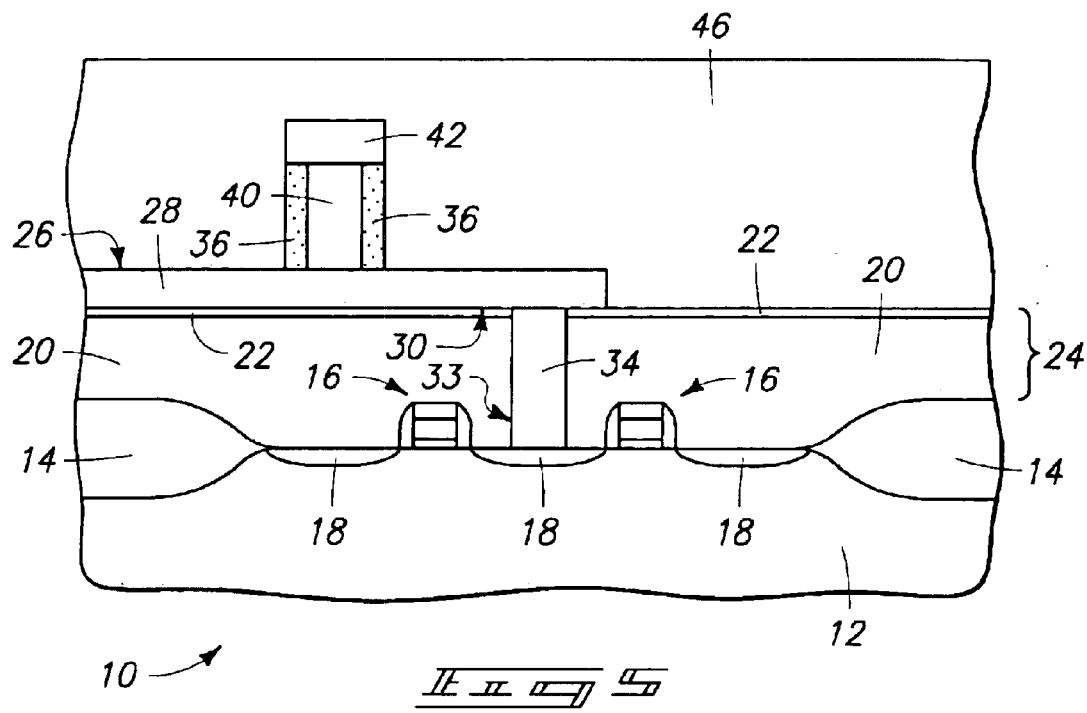
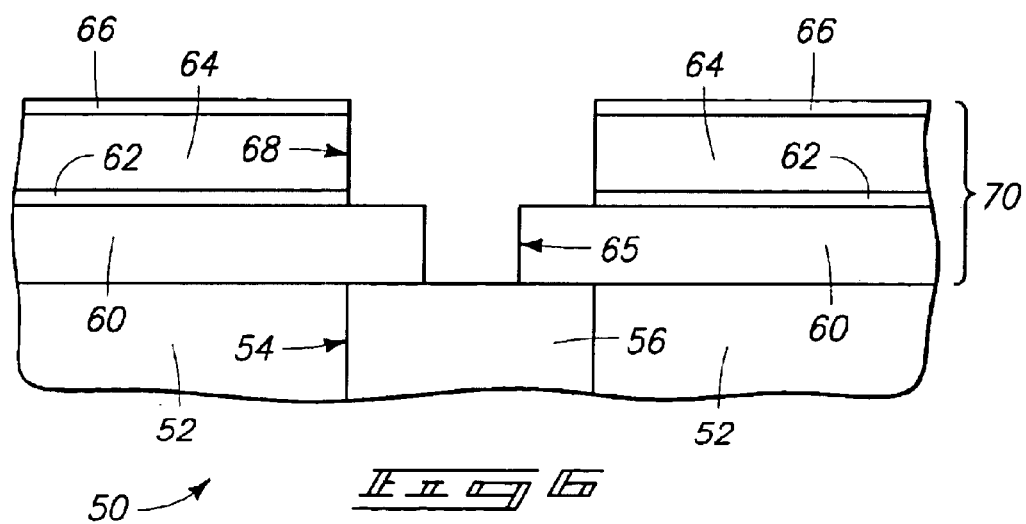

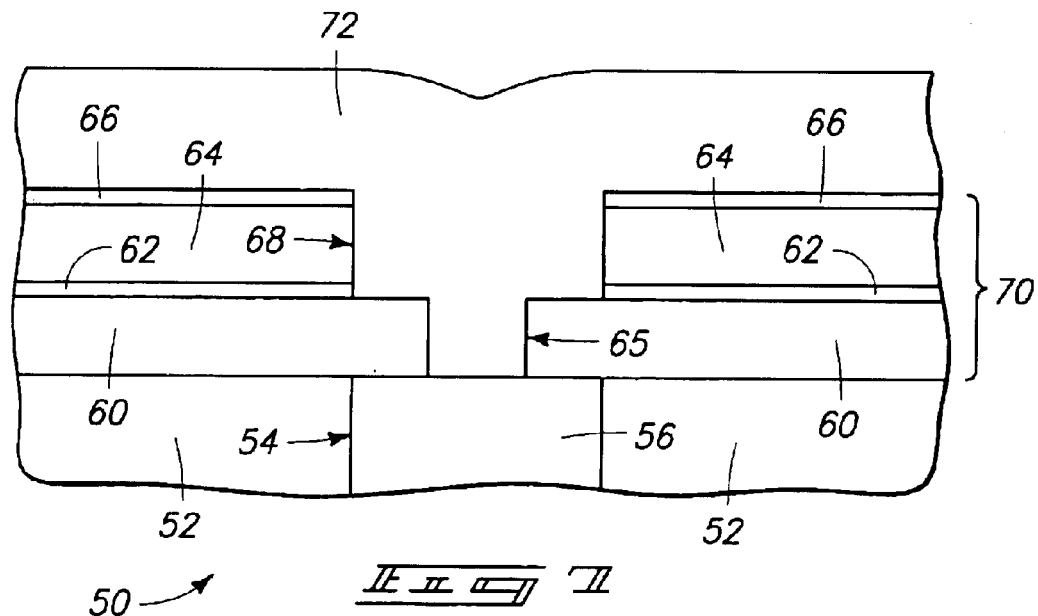
_FIG. 7_
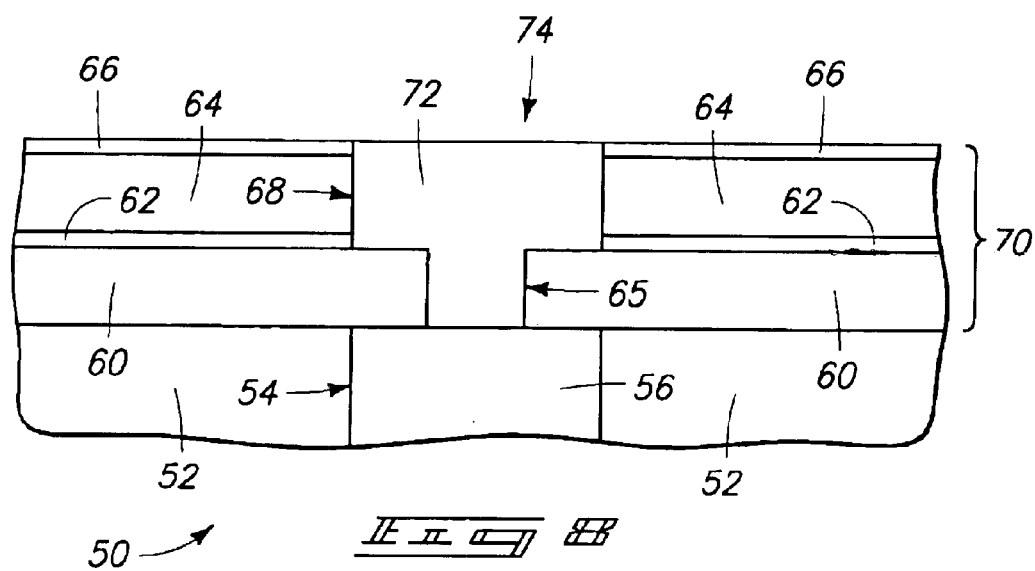
_FIG. 8_

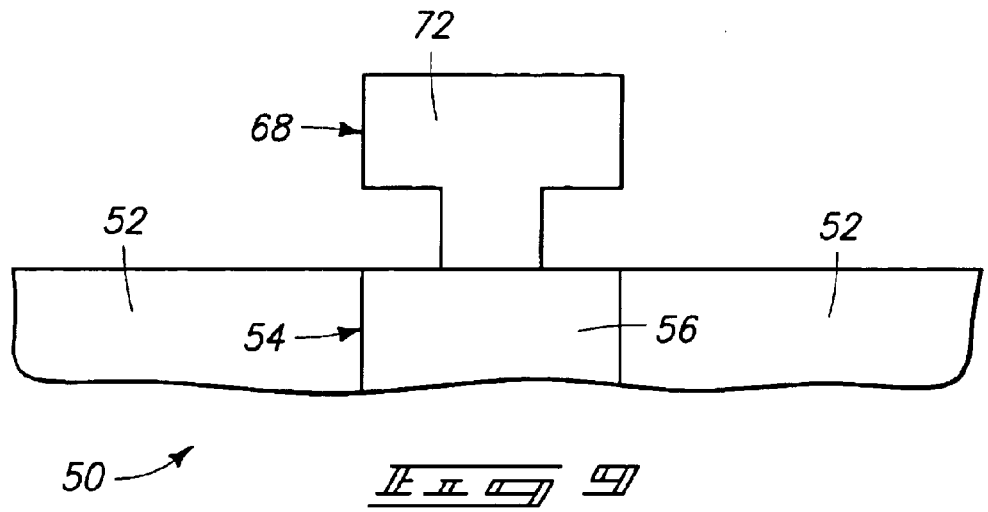
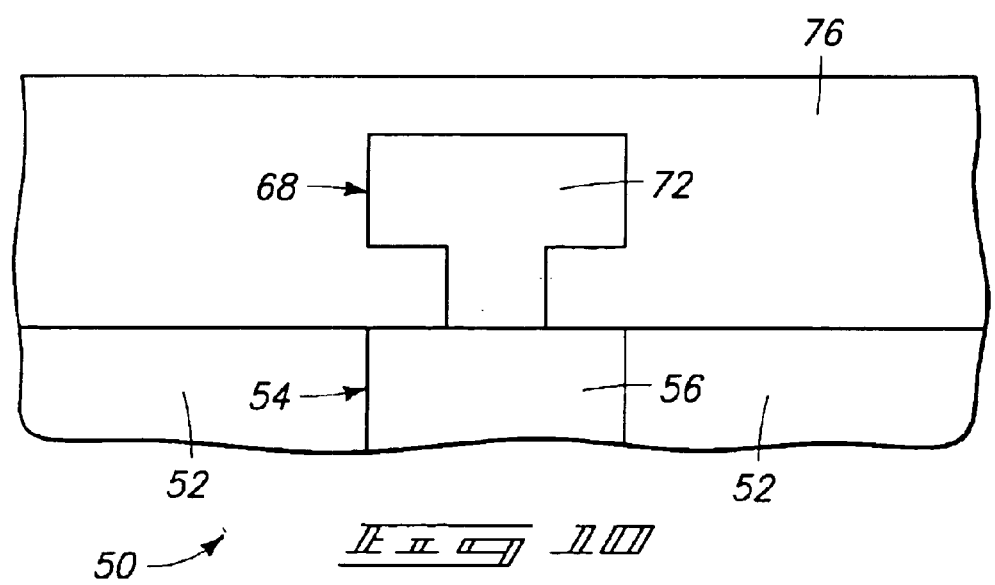

METHODS OF PROVIDING AN INTERLEVEL DIELECTRIC LAYER INTERMEDIATE DIFFERENT ELEVATION CONDUCTIVE METAL LAYERS IN THE FABRICATION OF INTEGRATED CIRCUITRY

RELATED PATENT DATA

This patent resulted from a continuation application of U.S. patent application Ser. No. 09/366,508, filed Aug. 3, 1999 now U.S. Pat. No. 6,350,679, entitled "Methods of Providing an Interlevel Dielectric Layer Intermediate Different Elevation Conductive Metal Layers in the Fabrication of Integrated Circuitry", naming Terrence McDaniel and Max F. Hineman as inventors, the disclosure of which is incorporated by reference.

TECHNICAL FIELD

This invention relates to methods of providing an interlevel dielectric layer intermediate different elevation conductive metal layers in the fabrication of integrated circuitry.

BACKGROUND OF THE INVENTION

In methods of forming integrated circuits, it is frequently desired to electrically isolate components of the integrated circuits from one another with an insulative material. For example, conductive layers can be electrically isolated from one another by separating them with an insulating material. Insulating material received between two different elevation conductive or component layers is typically referred to as an interlevel dielectric material. Also, devices which extend into a semiconductive substrate can be electrically isolated from one another by insulative materials formed within the substrate between the components, such as for example, trench isolation regions.

One typical insulative material for isolating components of integrated circuits is silicon dioxide, which has a dielectric constant of about 4. Yet in many applications, it is desired to utilize insulative materials having dielectric constants lower than that of silicon dioxide to reduce parasitic capacitance from occurring between conductive components separated by the insulative material. Parasitic capacitance reduction continues to have increasing importance in the semiconductor fabrication industry as device dimensions and component spacing continues to shrink. Closer spacing adversely effects parasitic capacitance.

One way of reducing the dielectric constant of certain inherently insulative materials is to provide some degree of carbon content therein. One example technique for doing so has recently been developed by Trikon Technology of Bristol, UK which they refer to as Flowfill™ Technology. Where more carbon incorporation is desired, methylsilane in a gaseous form and $H_2O_2$ in a liquid form are separately introduced into a chamber, such as a parallel plate reaction chamber. A reaction between the methylsilane and $H_2O_2$ can be moderated by introduction of nitrogen into the reaction chamber. A wafer is provided within the chamber and ideally maintained at a suitable low temperature, such as 0° C., at an exemplary pressure of 1 Torr to achieve formation of a methylsilanol structure. Such structure/material condenses on the wafer surface. Although the reaction occurs in the gas phase, the deposited material is in the form of a viscus liquid which flows to fill small gaps on the wafer surface. In applications where deposition thickness increases, surface tension drives the deposited layer flat, thus forming a planarized layer over the substrate.

The liquid methylsilanol is converted to a silicon dioxide structure by a two-step process occurring in two separate chambers from that in which the silanol-type structure was deposited. First, planarization of the liquid film is promoted by increasing the temperature to above 100° C., while maintaining the pressure at about 1 Torr, to result in solidification and formation of a polymer layer. Thereafter, the temperature is raised to approximately 450° C., while maintaining a pressure of about 1 Torr, to form $(CH_3)_y SiO_{(2-y)}$. y/2 is the percentage of $CH_3$ incorporated. The $(CH_3)_y SiO_{(2-y)}$ has a dielectric constant of less than or equal to about 3, and is accordingly less likely to be involved in parasitic capacitance than silicon dioxide and/or phosphorous doped silicon dioxide.

Other example low k dielectric layer materials include fluorine doped silicon dioxide, high; carbon and hydrogen containing materials, and other organic films having less than 20% silicon.

A prior art problem associated with low k dielectric material usage is that many of these materials cannot withstand high temperature processing. Specifically, many melt or gassify at comparatively low temperatures at which the substrate is subjected after deposition of the low k materials. This can essentially destroy the circuitry being fabricated. It is further very difficult to quickly strip photoresist when processing over such low k dielectric layers, as the typical photoresist stripping processes undesirably cause some isotropic etching of the low k dielectric layers.

SUMMARY

The invention comprises methods of providing an interlevel dielectric layer intermediate different elevation conductive metal layers in the fabrication of integrated circuitry. In one implementation, a method of providing an interlevel dielectric layer intermediate different elevation conductive metal layers in the fabrication of integrated circuitry includes forming a conductive metal interconnect layer over a substrate. An insulating dielectric mass is provided about the conductive metal interconnect layer. The insulating dielectric mass has a first dielectric constant. At least a majority of the insulating dielectric mass is etched away from the substrate. After the etching, an interlevel dielectric layer is deposited to replace at least some of the etched insulating dielectric material. The interlevel dielectric layer has a second dielectric constant which is less than the first dielectric constant.

BRIEF DESCRIPTION OF THE DRAWINGS

Preferred embodiments of the invention are described below with reference to the following accompanying drawings.

FIG. 3 is a view of the FIG. 1 wafer at a processing step subsequent to that depicted by FIG. 2.

FIG. 4 is a view of an alternate embodiment semiconductor wafer fragment at a processing step subsequent to that depicted by FIG. 2.

FIG. 5 is a view of the FIG. 1 wafer fragment at a processing step subsequent to that depicted by FIG. 3.

FIG. 6 is a diagrammatic sectional view of another alternate embodiment wafer fragment at a processing step in accordance with an aspect of the invention.

FIG. 7 is a view of the FIG. 6 wafer at a processing step subsequent to that shown by FIG. 6.

FIG. 8 is a view of the FIG. 6 wafer at a processing step subsequent to that depicted by FIG. 7.

FIG. 9 is a view of the FIG. 6 wafer fragment at a processing step subsequent to that depicted by FIG. 8.

FIG. 10 is a view of the FIG. 6 wafer at a processing step subsequent to that depicted by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
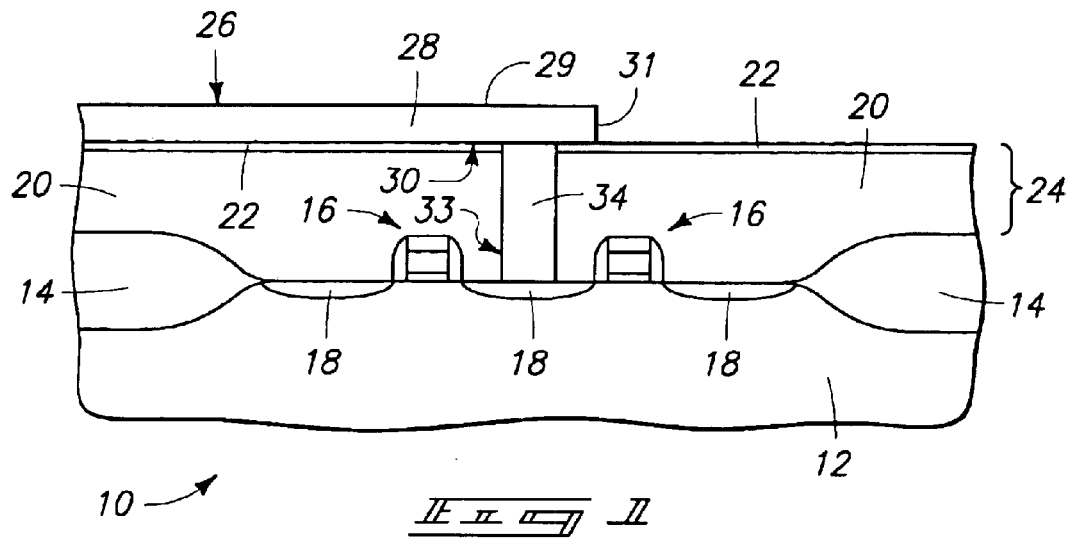
FIG. 1 is a diagrammatic sectional view of a semiconductor wafer fragment in process in accordance with an aspect of the invention.
Figure 2:
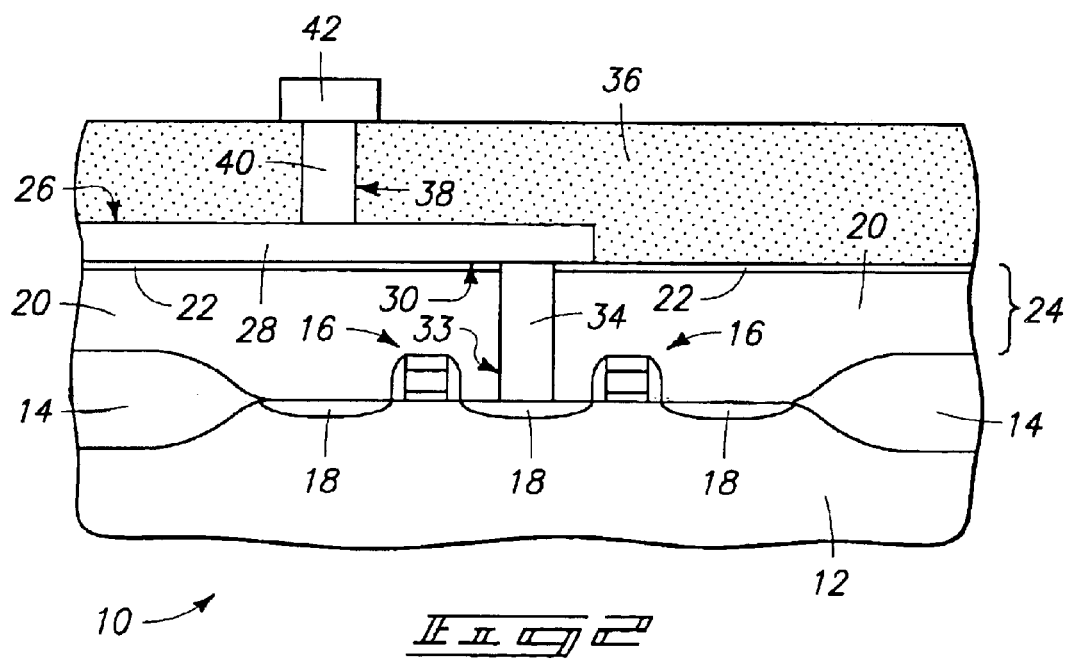
FIG. 2 is a view of the FIG. 1 wafer at a processing step subsequent to that depicted by FIG. 1.

A method of providing an interlevel dielectric layer intermediate different elevation conductive layers in the fabrication of integrated circuitry is initially described with reference to FIGS. 1–5. Referring initially to FIG. 1, a semiconductor wafer fragment in process is indicated generally with reference numeral 10. Such comprises a bulk semiconductive substrate 12, preferably lightly p-doped monocrystalline silicon, having field oxide regions 14 formed therein. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate", refers to any supporting structure, including, but not limited to, the semiconductive substrates described above.

A pair of gate line constructions 16 are fabricated over substrate 12, and comprise a gate dielectric layer, a conductive polysilicon layer, a conductive silicide layer, and insulating sidewalls spacers and caps, which are not specifically designated. Source/drain diffusion regions 18 are fabricated within substrate 12. Such constitute exemplary circuit devices which are at least partially fabricated over a substrate. Any alternate electric devices or components are also, of course, contemplated.

An insulating layer 20 is formed over devices 16 and substrate 12. An example and preferred material is borophosphosilicate glass (BPSG). An exemplary thickness is from 5,000 Angstroms to 30,000 Angstroms. An insulating layer 22 is formed over insulating layer 20. Such is preferably provided to function as an etch stop material, as will be described subsequently. Example materials include undoped silicon dioxide deposited by decomposition of tetraethylorthosilicate (TEOS) and silicon nitride. An exemplary thickness for layer 22 is from 0 Angstroms to 2,000 Angstroms. Layers 20 and 22 comprise but one example first insulating dielectric mass 24 which is formed over at least partially fabricated circuit devices over a substrate. An opening 33 has been formed in first insulating dielectric mass 24 between word line 16 to substrate diffusion region 18. Such has been filled with a conductive plugging material 34, for example conductively doped polysilicon or a metal, and planarized back to have an outermost surface substantially coincident with the outer surface of layer 22.

A first conductive interconnect layer 26 is formed over substrate 12. Preferred materials are elemental metals or metal alloys. Conductive interconnect layer 26 has been formed into the shape of at least one conductive interconnect line 28 having an outer top 29, an inner base 30 and sidewalls 31. Accordingly, first conductive interconnect layer 26 and line 28 are supported by first insulating dielectric mass 24.

A second insulating dielectric mass 36 is provided about conductive metal interconnect layer 26. Accordingly in this example, second insulating dielectric mass 36 is formed over another conductive metal interconnect layer, here in the form of layer 28. Further accordingly, second insulating dielectric mass 36 is formed over top 29 and sidewalls 31 of line 28. Example and preferred materials for layer 36 are the same as layer 20, for example BPSG. First insulating dielectric mass 24 has some first dielectric constant, with the dielectric constant of BPSG being about 3.9. An exemplary deposition thickness for layer 36 is from 1,000 Angstroms to 15,000 Angstroms, with layer 36 being shown as having been planarized subsequent to deposition. An opening 38 has been formed through layer 36 and filled with conductive material 40 for making electric connection with conductive line 28. An exemplary conductive line 42 has been patterned thereatop and over second insulating dielectric mass 36 for, in this example, providing conductive line interconnection between conductive line 42 and line 28. Accordingly, line 42 constitutes a second conductive interconnect layer and line which is supported at least partially by second insulating dielectric mass 36. Layers 42, 40, 26, and 34 are all preferably metallic. Most preferably at this point in the process, substantially all of the integrated circuitry to be fabricated relative to substrate 10 has been so fabricated. Further preferably, any subsequent processing relative to substrate 10 is preferably void of any photolithographic processing.

Referring to FIG. 3, at least a portion of second insulating dielectric mass 36 is etched away from substrate 10. More preferably, the etching removes at least a majority (if not all) of second insulating dielectric mass 36 from substrate 10. FIG. 3 depicts exemplary anisotropic etching, with a dry etching being an example. A specific example where layer 36 comprises BPSG is 12 sccm $C_4F_8$, 200 sccm Ar, 1300W source, 1400W bias, at 10 mTorr in a LAM 9100™ oxide etch chamber. Regardless and further preferably, the etching preferably comprises etching second insulating dielectric mass 36 inwardly to proximate line base 30. In the FIG. 3 depicted example, the etching has also been conducted substantially selectively relative to first conductive interconnect line 28 and second conductive interconnect line 42, and substantially selectively relative to etch stop layer 22 and accordingly relative to first insulative dielectric mass 24. Further preferably, such etching has been conducted to expose first conductive interconnect line 28 and first insulating dielectric mass 24.

Such etching in this example leaves insulating dielectric material 36 beneath conductive line 42 as shown. Exemplary alternate processing to that depicted by FIG. 3 is shown in FIG. 4. Here, essentially isotropic etching has been conducted and to a degree sufficient whereby no insulating dielectric material 36 has been left beneath conductive line 42, and such that the etching comprises etching essentially all of second insulating dielectric mass 36 from substrate 10. Exemplary preferred processing to achieve the illustrated FIG. 4 construction includes wet etching, for example utilizing a chemistry of HF, $NH_4F$:HF or a nonaqueous blend of glycol, phosphoric acid, HF and a carboxylic acid. The above recited specific chemistries will provide etch selectivity relative to aluminum lines and plugs, BPSG, and silicon nitride for layer 22. Removal of layer 36 results in lines 42 being supported by various conductive pillars 40 and/or remnant insulating layer 36.

Referring to FIG. 5, an interlevel dielectric layer 46 has been deposited to replace at least some of etched insulating dielectric material 36. Interlevel dielectric layer 46 has a second dielectric constant which is less than the first dielectric constant of layer 36. Example and preferred low k materials are those described above in the "Background" section, and include low k dielectric materials yet to be developed. In the preferred and FIG. 5 depicted example, the interlevel dielectric layer depositing preferably replaces all of insulating dielectric material 36 which was etched from the substrate as exemplified in the FIGS. 4 and 5 embodiments. Such layer is preferably planarized back as shown.

The above described exemplary processing depicts conductive metal interconnect layer and line 42 as being formed or otherwise provided after formation of second insulating dielectric mass 36, and by a subtractive etching of a deposited metal interconnect layer from which line 42 is formed. FIGS. 6–10 depict alternate exemplary processing whereby the line forming comprises a damascene etching of an insulating dielectric mass into a desired line shape. FIG. 6 depicts a wafer fragment in process indicated generally by reference numeral 50. Such includes an insulating layer 52 having an opening 54 formed therein. A conductive plugging material 56 is received within opening 54. An insulating dielectric layer 60 is formed over layer 52, and a preferred insulating etch stop layer 62 is formed thereover. An opening 65 has been etched through layers 62 and 60 to expose plugging material 56. Thereafter, insulating and etch stop layers 64 and 66, respectively, have been formed over layer 62. A desired line shape opening 68 has been patterned and formed through layers 66 and 64, and overlies the illustrated singular opening 65. Layers 60, 62, 64 and 66 constitute but one exemplary insulating dielectric mass 70.

Referring to FIG. 7, a conductive interconnect layer 72 is deposited to fill damascene line opening 68 and contact opening 64.

Referring to FIG. 8, layer 72 has been planarized back to provide a desired patterned and isolated conductive interconnect line 74.

Referring to FIG. 9, insulating dielectric mass 70 has been etched away from substrate 50. Isotropic or anisotropic etching could be conducted as described above, whereby some or none of insulating dielectric mass 70 remains over the substrate.

Referring to FIG. 10, an interlevel dielectric layer 76 has been deposited to replace at least some, and here all, of etched insulating dielectric material 70. Layer 76 has a lower overall k value than does insulative mass 70 which was removed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of providing an interlevel dielectric layer intermediate different elevation conductive metal layers in the fabrication of integrated circuitry, the method comprising:

forming a conductive metal interconnect layer over a substrate;

providing an insulating dielectric mass about the conductive metal interconnect layer, the insulating dielectric mass having a first dielectric constant;

etching at least a majority of the insulating dielectric mass away from the substrate; and after the etching, depositing an interlevel dielectric layer to replace at least some of the etched insulating dielectric material, the interlevel dielectric layer having a second dielectric constant which is less than the first dielectric constant.

2. The method of claim 1 wherein the conductive metal interconnect layer is formed after providing the insulating dielectric mass.

3. The method of claim 1 comprising forming the conductive interconnect layer into a conductive line, the line forming comprising a subtractive etching of the metal interconnect layer.

4. The method of claim 1 comprising forming the conductive interconnect layer into a conductive line, the line forming comprising a damascene etching of the insulating dielectric mass into a desired line shape.

5. The method of claim 1 wherein the first dielectric constant is at least 3.9, and the second dielectric constant is less than 3.9.

6. The method of claim 1 wherein the depositing replaces all of the insulating mass which was etched from the substrate during the etching.

7. The method of claim 1 wherein the etching comprises isotropic etching.

8. The method of claim 1 wherein the etching comprises anisotropic etching.

9. The method of claim 1 wherein the insulating dielectric mass is formed over another conductive metal interconnect layer, the etching comprising etching all the insulating dielectric mass from the substrate.

10. The method of claim 1 wherein the etching is conducted substantially selective relative to the conductive metal interconnect layer.

11. The method of claim 1 wherein the etching is conducted after substantially all of the integrated circuitry to be fabricated has been fabricated on the substrate.

12. The method of claim 1 being void of any photolithographic processing of the substrate after the etching.

13. A method of providing an interlevel dielectric layer intermediate different elevation conductive layers in the fabrication of integrated circuitry, the method comprising:

forming a first insulating dielectric mass over at least partially fabricated circuit devices over a substrate;

forming a first conductive interconnect layer supported by the first insulating dielectric mass;

forming a second insulating dielectric mass over the first conductive interconnect layer, the second insulating dielectric mass having a first dielectric constant;

forming a second conductive interconnect layer supported by the second insulating dielectric mass;

etching at least a portion of the second insulating dielectric mass away from the substrate; and after the etching, depositing an interlevel dielectric layer to replace at least some of the etched second insulating dielectric material, the interlevel dielectric layer having a second dielectric constant which is less than the first dielectric constant.

14. The method of claim 13 wherein the portion etched is a majority of the second insulating dielectric mass.

15. The method of claim 13 comprising providing the first conductive interconnect layer in the shape of at least one conductive interconnect line, wherein the first conductive interconnect line has an inner base, sidewalls and an outer top, the second insulating dielectric mass being formed over the top and the sidewalls, the etching comprising etching the second insulating dielectric mass inwardly to proximate the base.

16. The method of claim 13 wherein the etching comprises isotropic etching.

17. The method of claim 13 wherein the etching comprises anisotropic etching.

18. The method of claim 13 wherein the etching etches all of the second insulating dielectric mass from the substrate.

19. The method of claim 13 wherein the etching exposes the first conductive interconnect layer.

20. The method of claim 13 comprising providing the second conductive interconnect layer into the shape of at least one conductive line, the etching leaving second insulating dielectric material beneath the conductive line.

21. The method of claim 13 comprising providing the second conductive interconnect layer into the shape of at least one conductive line, the etching not leaving second insulating dielectric material beneath the conductive line.

22. The method of claim 13 wherein the first and second conductive interconnect layers are metallic.

23. The method of claim 13 wherein the etching is conducted after substantially all of the integrated circuitry to be fabricated has been fabricated on the substrate.

24. The method of claim 13 being void of any photolithographic processing of the substrate after the etching.

25. A method of providing an interlevel dielectric layer intermediate different elevation conductive layers in the fabrication of integrated circuitry, the method comprising:

forming a first insulating dielectric mass over at least partially fabricated circuit devices over a substrate;

forming a first conductive interconnect line supported by the first insulating dielectric mass;

forming a second insulating dielectric mass over the first conductive interconnect line, the second insulating dielectric mass having a first dielectric constant;

forming a second conductive interconnect line supported by the second insulating dielectric mass;

etching a majority of the second insulating dielectric mass away from the substrate substantially selectively relative to the first and second conductive interconnect lines and substantially selectively relative to the first insulative dielectric mass, the etching exposing the first conductive interconnect line and the first insulating dielectric mass; and after the etching, depositing an interlevel dielectric layer to replace at least some of the etched second insulating dielectric material, the interlevel dielectric layer having a second dielectric constant which is less than the first dielectric constant.

26. The method of claim 25 wherein the etching leaves second insulating dielectric material beneath the second conductive interconnect line.

27. The method of claim 25 wherein the etching does not leave second insulating dielectric material beneath the second conductive interconnect line.

28. The method of claim 25 wherein the etching comprises isotropic etching.

29. The method of claim 25 wherein the etching comprises anisotropic etching.

30. The method of claim 25 wherein the etching etches all of the second insulating dielectric mass from the substrate.

31. The method of claim 25 wherein the etching is conducted after substantially all of the integrated circuitry to be fabricated has been fabricated on the substrate.

32. The method of claim 25 being void of any photolithographic processing of the substrate after the etching.

* * * * *

UNITED STATES PATENT AND TRADEMARK OFFICE
CERTIFICATE OF CORRECTION

PATENT NO. : 6,844,255 B2
DATED : January 18, 2005
INVENTOR(S) : McDaniel et al.

It is certified that error appears in the above-identified patent and that said Letters Patent is hereby corrected as shown below:

Title page,
Item [56], References Cited, U.S. PATENT DOCUMENTS,
please insert the following references before "5,023,200":
-- 4,572,848    02/1986    Pollak et al.
   4,843,034    06/27/89   Herndon et al. --.
please insert the following reference before "5,103,288":
-- 5,061,514    10/1991    Boeglin --.
please insert the following reference before "5,171,713":
-- 5,165,991    11/1992    Fukuda et al. --.
please insert the following reference before "5,380,679":
-- 5,380,511    01/1995    Arahori et al. --.
please insert the following reference before "5,470,801":
-- 5,466,617    11/1995    Shannon --.
please insert the following reference before "5,583,078":
-- 5,559,666    9/1996     Figura --.
please insert the following references before "5,773,363":
-- 5,736,459    04/1998    Tseng
   5,750,415    05/12/98   Gnade et al. --.
please insert the following reference before "5,861,345":
-- 5,858,871    01/12/99   Jeng --.
please insert the following reference before "6,028,015":
-- 6,008,540    12/1999    Lu et al. --.
please insert the following references before "6,156,374":
-- 6,039,847    03/2000    Chayahara et al.
   6,143,645    11/2000    Hsu et al. --.
please insert the following references before "6,245,439 B1":
-- 6,184,572 B1    02/2001    Mountsier et al.
   6,204,172 B1    03/2001    Marsh
   6,207,583 B1    03/2001    Dunne et al. --.
please insert the following reference before "6,313,046 B1":
-- 6,271,146 B1    08/2001    Ross --.
please insert the following reference before "6,333,556 B1":
-- 6,319,852 B1    11/20/01   Smith et al. --.
please insert the following references after "6,350,679 B1":
-- 6,351,039 B1    02/2002    Jin et al.
   6,448,187 B2    09/2002    Yau et al.
   6,495,458 B2    12/2002    Marsh
   6,589,887 B1    07/2003    Dalton et al. --.

UNITED STATES PATENT AND TRADEMARK OFFICE
CERTIFICATE OF CORRECTION

PATENT NO. : 6,844,255 B2
DATED : January 18, 2005
INVENTOR(S) : McDaniel et al.

It is certified that error appears in the above-identified patent and that said Letters Patent is hereby corrected as shown below:

<u>Column 3,</u>
Line 30, please delete ".(either" after "layers" and insert -- (either --.

Signed and Sealed this

Eighth Day of November, 2005

JON W. DUDAS
*Director of the United States Patent and Trademark Office*